(12) United States Patent
Utsunomiya

(10) Patent No.: US 7,868,622 B2
(45) Date of Patent: Jan. 11, 2011

(54) CIRCUIT FOR DETECTING POWER SUPPLY VOLTAGE DROP

(75) Inventor: Fumiyasu Utsunomiya, Chiba (JP)

(73) Assignee: Seiko Instruments Inc., Chiba (JP)

( * ) Notice: Subject to any disclaimer, the term of this patent is extended or adjusted under 35 U.S.C. 154(b) by 335 days.

(21) Appl. No.: 12/188,766

(22) Filed: Aug. 8, 2008

(65) Prior Publication Data

US 2009/0040676 A1 Feb. 12, 2009

(30) Foreign Application Priority Data

Aug. 10, 2007 (JP) ............................. 2007-209106
Aug. 5, 2008 (JP) ............................. 2008-201662

(51) Int. Cl.
*G01R 31/08* (2006.01)

(52) U.S. Cl. ................... 324/522; 324/713; 702/58; 702/64

(58) Field of Classification Search ................. 324/522
See application file for complete search history.

(56) References Cited

U.S. PATENT DOCUMENTS 5,623,216 A * 4/1997 Penza et al. .................... 326/27
5,838,191 A * 11/1998 Opris et al. .................. 327/539
7,161,861 B2 * 1/2007 Gogl et al. ................... 365/207
2006/0261860 A1 * 11/2006 Yamada ......................... 327/77
2008/0191787 A1 * 8/2008 Nedovic ....................... 327/536

FOREIGN PATENT DOCUMENTS

JP 2005-278056 A 10/2005

OTHER PUBLICATIONS

Tomoya et al., JP 2005-278056, JPO Machine Translation, English version, Aug. 31, 2010.*

* cited by examiner

*Primary Examiner*—Thomas Valone
(74) *Attorney, Agent, or Firm*—Brinks Hofer Gilson & Lione

(57) ABSTRACT

Provided is a circuit for detecting power supply voltage drop having a small circuit scale. An NMOS transistor (12) generates a source voltage based on a voltage obtained by subtracting an absolute value of a threshold voltage and an overdrive voltage from a power supply voltage with reference to the power supply voltage. An NMOS transistor (17) is turned on/off based on the source voltage of the NMOS transistor (12). A PMOS transistor (15) generates a source voltage based on a voltage obtained by adding an absolute value of a threshold voltage and an overdrive voltage to a ground voltage with reference to the ground voltage. A PMOS transistor (19) is turned on/off based on the source voltage of the PMOS transistor (15).

1 Claim, 4 Drawing Sheets

US 7,868,622 B2

CIRCUIT FOR DETECTING POWER SUPPLY VOLTAGE DROP

RELATED APPLICATIONS

This application claims priority under 35 U.S.C. §119 to Japanese Patent Application Nos. JP2007-209106 filed on Aug. 10, 2007 and JP2008-201662 filed on Aug. 5, 2008, the entire contents of which are hereby incorporated by reference.

BACKGROUND OF THE INVENTION

1. Field of the Invention

The present invention relates to a circuit for detecting power supply voltage drop, which detects a drop of a power supply voltage.

2. Description of the Related Art

In general, a semiconductor device is equipped with a circuit for detecting power supply voltage drop, which detects a drop of a power supply voltage. When the circuit for detecting power supply voltage drop detects that a power supply voltage becomes lower than a minimum operating voltage, the semiconductor device is prevented from malfunctioning by shutting down a malfunctioning circuit or all circuits other than the circuit for detecting power supply voltage drop.

A description is given of a minimum operating voltage of a semiconductor device.

FIG. 5 is a diagram illustrating an example of an element circuit. The circuit shown in FIG. 5 is a current mirror circuit of an NMOS-cascode type including NMOS transistors 31 to 34. The minimum operating voltage of this circuit is a sum voltage obtained by adding: the sum of the absolute value of the threshold voltage of the NMOS transistor 31 and the overdrive voltage thereof; and the sum of the absolute value of the threshold voltage of the NMOS transistor 32 and the overdrive voltage thereof.

FIG. 6 is a diagram illustrating an example of another element circuit. The circuit shown in FIG. 6 is a current mirror circuit of a PMOS-cascode type including PMOS transistors 41 to 44. The minimum operating voltage of this circuit is a sum voltage obtained by adding: the sum of the absolute value of the threshold voltage of the PMOS transistor 41 and the overdrive voltage thereof; and the sum of the absolute value of the threshold voltage of the PMOS transistor 42 and the overdrive voltage thereof.

FIG. 7 is a diagram illustrating an example of still another element circuit. The circuit shown in FIG. 7 is a constant current circuit including a PMOS transistor 51, PMOS transistors 55 and 56, an NMOS transistor 52, an NMOS transistor 54, and a resistor 53. When a signal for operating this circuit is input through a gate of the PMOS transistor 55 to turn on the PMOS transistor 55, this circuit is operated. The minimum operating voltage of this circuit is a voltage corresponding to higher one of the following two sum voltages. One sum voltage is obtained by adding: the sum of the absolute value of the threshold voltage of the NMOS transistor 52 and the overdrive voltage thereof; and the sum of the absolute value of the threshold voltage of the NMOS transistor 54 and the overdrive voltage thereof. The other sum voltage is obtained by adding: the sum of the absolute value of the threshold voltage of the PMOS transistor 55 and the overdrive voltage thereof; and the sum of the absolute value of the threshold voltage of the PMOS transistor 56 and the overdrive voltage thereof.

In general, the above-mentioned element circuit is frequently used in a semiconductor device. Therefore, the minimum operating voltage of the semiconductor device is a voltage corresponding to higher one of the following two sum voltages. One sum voltage is obtained by adding, in two NMOS transistors having the highest sum voltages in the semiconductor device: the sum of the absolute value of the threshold voltage of one NMOS transistor and the overdrive voltage thereof; and the sum of the absolute value of the threshold voltage of another NMOS transistor and the overdrive voltage thereof. The other sum voltage is obtained by adding, in two PMOS transistors having the highest sum voltages in the semiconductor device: the sum of the absolute value of the threshold voltage of one PMOS transistor and the overdrive voltage thereof; and the sum of the absolute value of the threshold voltage of another PMOS transistor and the overdrive voltage thereof.

A description is given of a conventional circuit for detecting power supply voltage drop. FIG. 8 is a diagram illustrating a conventional circuit for detecting power supply voltage drop.

The conventional circuit for detecting power supply voltage drop includes a reference voltage circuit 72 for generating a reference voltage, a voltage dividing circuit 73 for dividing a power supply voltage from a power supply 71 through resistors 75 and 76 to generate a divided voltage, a differential amplifier circuit 74 for comparing the divided voltage with the reference voltage to detect the drop of the power supply voltage, and a pull-up resistor 77 for pulling up an output terminal of the differential amplifier circuit 74 (for example, see JP 2005-278056 A).

However, in the circuit disclosed in JP 2005-278056 A, the reference voltage circuit, the voltage dividing circuit, and the differential amplifier circuit are necessary, which increases a circuit scale. As a result, a larger amount of current is consumed.

SUMMARY OF THE INVENTION

In view of the above-mentioned problem, the present invention provides a circuit for detecting power supply voltage drop having a small circuit scale.

In order to solve the above-mentioned problem, the present invention provides the circuit for detecting power supply voltage drop, which detects a drop of a power supply voltage, including: a first transistor that is of a first conductive type and generates a source voltage based on a voltage obtained by subtracting an absolute value of a threshold voltage and an overdrive voltage from the power supply voltage with reference to the power supply voltage; a second transistor that is of the first conductive type and turned on/off based on the source voltage of the first transistor; a third transistor that is of a second conductive type and generates a source voltage based on a voltage obtained by adding an absolute value of a threshold voltage and an overdrive voltage to a ground voltage with reference to the ground voltage; a fourth transistor that is of the second conductive type and turned on/off based on the source voltage of the third transistor; a first constant current circuit that supplies a current to the first transistor; a second constant current circuit that supplies a current to each of the second transistor and the third transistor; and a third constant current circuit that supplies a current to the fourth transistor.

In the circuit for detecting power supply voltage drop according to the present invention, the reference voltage circuit, the voltage dividing circuit, and the differential amplifier circuit are not necessary, which reduces a circuit scale. As a result, a smaller amount of current is consumed correspondingly.

DETAILED DESCRIPTION OF THE PREFERRED EMBODIMENT

Hereinafter, a description is given of an embodiment of a circuit for detecting power supply voltage drop according to the present invention with reference to the drawings.

Figure 1:
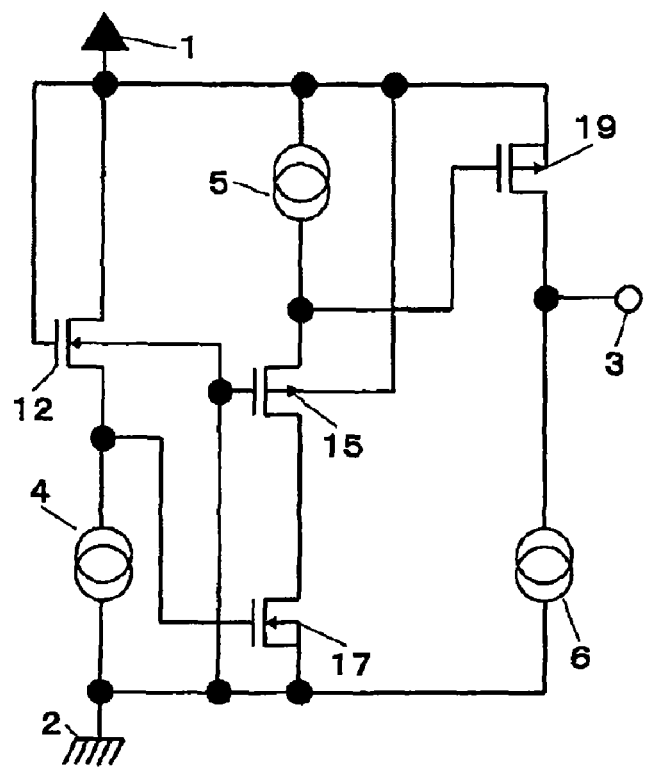
FIG. 1 is a diagram illustrating a circuit for detecting power supply voltage drop according to the present invention.

FIG. 1 is a diagram illustrating the circuit for detecting power supply voltage drop according to the present invention.

The circuit for detecting power supply voltage drop according to the present invention includes a power supply terminal 1, a ground terminal 2, and an output terminal 3. Further, the circuit for detecting power supply voltage drop includes constant current circuits 4 to 6. Further, the circuit for detecting power supply voltage drop includes NMOS transistors 12 and 17 and PMOS transistors 15 and 19.

The constant current circuit 4 is provided between the source of the NMOS transistor 12 and the ground terminal 2. The constant current circuit 5 is provided between the power supply terminal 1 and the source of the PMOS transistor 15. The constant current circuit 6 is provided between the output terminal 3 and the ground terminal 2. The gate and the drain of the NMOS transistor 12 are connected to the power supply terminal 1, and the back gate of the NMOS transistor 12 is connected to the ground terminal 2. The gate of the NMOS transistor 17 is connected to the source of the NMOS transistor 12, the source and the back gate of the NMOS transistor 17 are connected to the ground terminal 2, and the drain of the NMOS transistor 17 is connected to the drain of the PMOS transistor 15. The gate of the PMOS transistor 15 is connected to the ground terminal 2, and the back gate of the PMOS transistor 15 is connected to the power supply terminal 1. The gate of the PMOS transistor 19 is connected to the source of the PMOS transistor 15, the source and the back gate of the PMOS transistor 19 are connected to the power supply terminal 1, and the drain of the PMOS transistor 19 is connected to the output terminal 3.

In the NMOS transistors 12 and 17, the following first sum voltage is higher than the following second sum voltage. The first sum voltage is obtained by adding: the sum of the absolute value of the threshold voltage of the NMOS transistor 12 and the overdrive voltage thereof; and the sum of the absolute value of the threshold voltage of the NMOS transistor 17 and the overdrive voltage thereof. The second sum voltage is obtained by adding, in two predetermined NMOS transistors in the semiconductor device: the sum of the absolute value of the threshold voltage of one NMOS transistor and the overdrive voltage thereof; and the sum of the absolute value of the threshold voltage of another NMOS transistor and the overdrive voltage thereof. The same is applied to the PMOS transistors 15 and 19.

The constant current circuit 4 supplies a current to the NMOS transistor 12. The constant current circuit 5 supplies a current to each of the NMOS transistor 17 and the PMOS transistor 15. The constant current circuit 6 supplies a current to the PMOS transistor 19. The NMOS transistor 12 generates a source voltage based on a voltage obtained by subtracting the absolute value of the threshold voltage and the overdrive voltage from the power supply voltage with reference to the power supply voltage. Based on the source voltage, the NMOS transistor 17 is turned on/off. The PMOS transistor 15 generates a source voltage based on a voltage obtained by adding the absolute value of the threshold voltage and the overdrive voltage to the ground voltage with reference to the ground voltage. Based on the source voltage, the PMOS transistor 19 is turned on/off.

Next, a description is given of an operation of the circuit for detecting power supply voltage drop.

In this example, the absolute value of the threshold voltage of the NMOS transistor is Vtn, and the absolute value of the threshold voltage of the PMOS transistor is Vtp.

[Detecting Operation for Power Supply Voltage Drop when Vtp>Vtn (when NMOS is Less Likely to be Turned off than PMOS)]

As the power supply voltage becomes lower, the gate voltage of the NMOS transistor 12 becomes lower, and the NMOS transistor 12 is gradually turned off. Similarly, the gate voltage of the NMOS transistor 17 becomes lower, and the NMOS transistor 17 is gradually turned off. As a result, the gate voltage of the PMOS transistor 19 becomes higher, and the PMOS transistor 19 is gradually turned off. When the power supply voltage is below 2 Vtp, the NMOS transistors 12 and 17 are still on. However, the gate voltage of the PMOS transistor 19 does not completely become low by the PMOS transistor 15, and the PMOS transistor 19 is turned off. Therefore, when the power supply voltage is below 2 Vtp, that is, when the power supply voltage is lower than the minimum operating voltage of the semiconductor device, the circuit for detecting power supply voltage drop outputs a low signal as a detection signal through the output terminal 3 to the outside.

[Detecting Operation for Power Supply Voltage Drop when Vtp<Vtn (when PMOS is Less Likely to be Turned off than NMOS)]

When the power supply voltage becomes lower to reach below 2 Vtn, the NMOS transistor 12 is still on. However, the gate voltage of the NMOS transistor 17 does not completely become high by the constant current circuit 4, and the NMOS transistor 17 is turned off. The gate voltage of the PMOS transistor 19 becomes high, and the PMOS transistor 19 is also turned off. Therefore, when the power supply voltage is below 2 Vtn, that is, when the power supply voltage is lower than the minimum operating voltage of the semiconductor device, the circuit for detecting power supply voltage drop outputs a low signal as a detection signal through the output terminal 3 to the outside.

[Detecting and Canceling Operation for Power Supply Voltage Drop when Vtp>Vtn (when NMOS is More Likely to be Turned on than PMOS)]

As the power supply voltage becomes higher again after keeping below both 2 Vtp and 2 Vtn, the gate voltage of the NMOS transistor 12 becomes higher, and the NMOS transistor 12 is gradually turned on. Similarly, the gate voltage of the NMOS transistor 17 becomes higher, and the NMOS transistor 17 is gradually turned on. As a result, the gate voltage of the PMOS transistor 19 becomes lower, and the PMOS transistor 19 is also gradually turned on. When the power supply voltage is equal to or higher than 2 Vtn, the NMOS transistors 12 and 17 are turned on. However, the gate voltage of the PMOS transistor 19 does not completely become low by the PMOS transistor 15, and the PMOS transistor 19 is still off. When the power supply voltage is equal to or higher than 2 Vtp, the NMOS transistors 12 and 17 are already turned on, the gate voltage of the PMOS transistor 19 becomes low, and the PMOS transistor 19 is also turned on. Therefore, when the power supply voltage is equal to or higher than 2 Vtp, that is, when the power supply voltage is equal to or higher than the minimum operating voltage of the semiconductor device, the circuit for detecting power supply voltage drop outputs a high signal as a detection signal through the output terminal 3 to the outside.

[Detecting and Canceling Operation for Power Supply Voltage Drop when Vtp<Vtn (when PMOS is More Likely to be Turned on than NMOS)]

As the power supply voltage becomes higher again to reach equal to or higher than 2 Vtn after keeping below both 2 Vtp and 2 Vtn, the NMOS transistors 12 and 17 are turned on. The gate voltage of the PMOS transistor 19 becomes low, and the PMOS transistor 19 is also turned on. Therefore, when the power supply voltage is equal to or higher than 2 Vtn, that is, when the power supply voltage is equal to or higher than the minimum operating voltage of the semiconductor device, the circuit for detecting power supply voltage drop outputs a high signal as a detection signal through the output terminal 3 to the outside.

Figure 2:
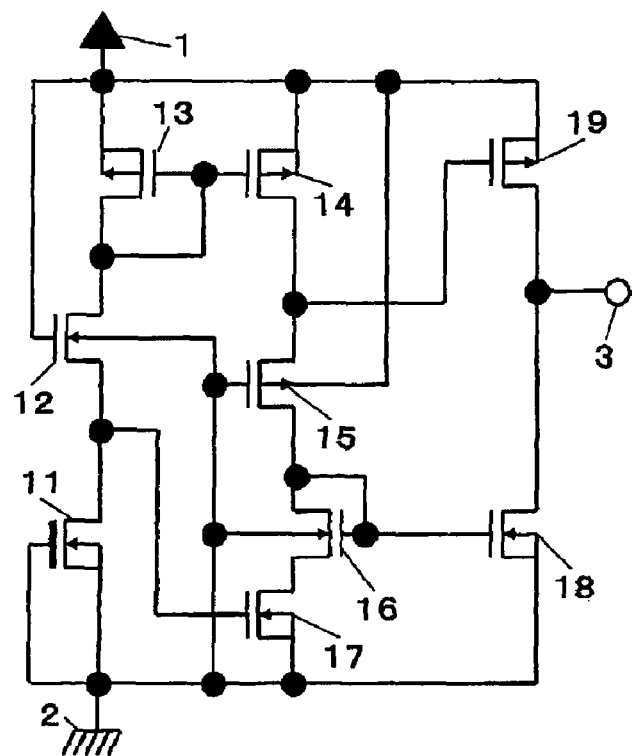
FIG. 2 is a diagram illustrating a constant current circuit of a circuit for detecting power supply voltage drop according to the present invention.

Next, a description is given of the constant current circuit. FIG. 2 is a diagram illustrating a constant current circuit of a circuit for detecting power supply voltage drop according to the present invention.

The constant current circuit 4 is realized by, for example, a depletion type NMOS transistor 11. The gate, the source, and the back gate of the depletion type NMOS transistor 11 are connected to the ground terminal 2, and the drain of the depletion type NMOS transistor 11 is connected to the source of the NMOS transistor 12. The drain of the depletion type NMOS transistor 11 draws a current from the source of the NMOS transistor 12.

The constant current circuit 5 is realized by, for example, the depletion type NMOS transistor 11 and PMOS transistors 13 and 14. The gate and the drain of the PMOS transistor 13 are connected to the drain of the NMOS transistor 12, and the source and the back gate of the PMOS transistor 13 are connected to the power supply terminal 1. The gate of the PMOS transistor 14 is connected to the gate of the PMOS transistor 13, the source and the back gate of the PMOS transistor 14 are connected to the power supply terminal 1, and the drain of the PMOS transistor 14 is connected to the source of the PMOS transistor 15. The drain of the PMOS transistor 14 supplies the current based on the current of the constant current circuit 4 to the source of the PMOS transistor 15.

The constant current circuit 6 is realized by, for example, the depletion type NMOS transistor 11, the PMOS transistors 13 and 14, and NMOS transistors 16 and 18. The gate and the drain of the NMOS transistor 16 are connected to the drain of the PMOS transistor 15, the source of the NMOS transistor 16 is connected to the drain of the NMOS transistor 17, and the back gate of the NMOS transistor 16 is connected to the ground terminal 2. The gate of the NMOS transistor 18 is connected to the gate of the NMOS transistor 16, the source and the back gate of the NMOS transistor 18 are connected to the ground terminal 2, and the drain of the NMOS transistor 18 is connected to the drain of the PMOS transistor 19. The drain of the NMOS transistor 18 draws the current based on the current of the constant current circuit 4 from the drain of the PMOS transistor 19.

With the above-mentioned structure, in the circuit for detecting power supply voltage drop, a reference voltage circuit, a voltage dividing circuit, and a differential amplifier circuit are not necessary, which reduces a circuit scale. As a result, a smaller amount of current is consumed.

Further, when the reference voltage circuit and the voltage dividing circuit are used, production variation occurs, which causes variation in reference voltage. Accordingly, the resistance ratio of resistors in the voltage dividing circuit needs to be trimmed according to the variation in reference voltage. In this embodiment, since the reference voltage circuit and the voltage dividing circuit are not used, the trimming is not necessary. As a result, production processes are reduced to enable a shorter production period and a lower production cost.

Further, in the case of Vtp>Vtn, when the power supply voltage is below 2 Vtp, that is, when the power supply voltage is lower than the minimum operating voltage of the semiconductor device, the circuit for detecting power supply voltage drop outputs a low signal as a detection signal through the output terminal 3 to the outside. Therefore, the semiconductor device is prevented from malfunctioning.

Further, in the case of Vtp<Vtn, when the power supply voltage is below 2 Vtn, that is, when the power supply voltage is lower than the minimum operating voltage of the semiconductor device, the circuit for detecting power supply voltage drop outputs a low signal as a detection signal through the output terminal 3 to the outside. Therefore, the semiconductor device is prevented from malfunctioning.

Both in the case of Vtp>Vtn and in the case of Vtp<Vtn, when the power supply voltage is lower than the minimum operating voltage of the semiconductor device, the circuit for detecting power supply voltage drop outputs a low signal as a detection signal through the output terminal 3 to the outside. Therefore, the semiconductor device is prevented from malfunctioning.

The NMOS transistors shown in FIGS. 1 and 2 may be replaced by PMOS transistors. The PMOS transistors shown in FIGS. 1 and 2 may be replaced by NMOS transistors.

Figure 3:
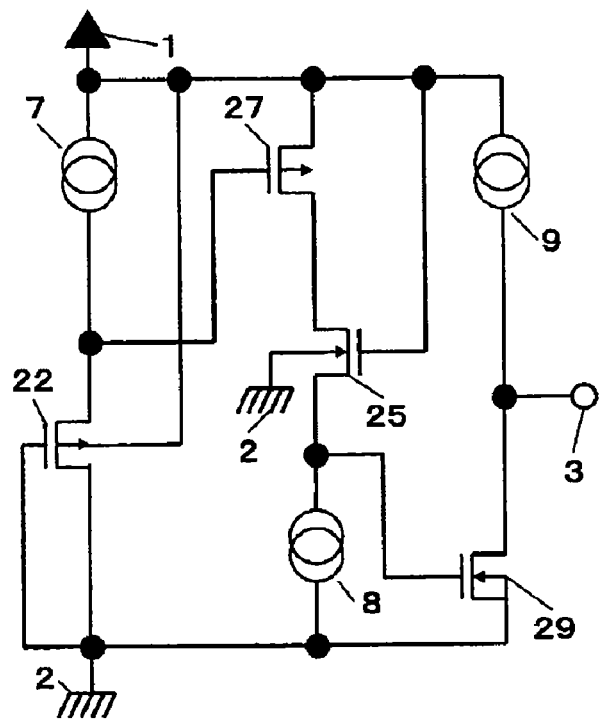
FIG. 3 is a diagram illustrating another circuit for detecting power supply voltage drop according to the present invention.

FIG. 3 is a diagram illustrating another circuit for detecting power supply voltage drop according to the present invention. In the difference of the circuit for detecting power supply voltage drop in FIG. 1, the constant current circuit 4 is replaced by a constant current circuit 7. The constant current circuit 5 is replaced by a constant current circuit 8. The constant current circuit 6 is replaced by a constant current circuit 9.

Figure 4:
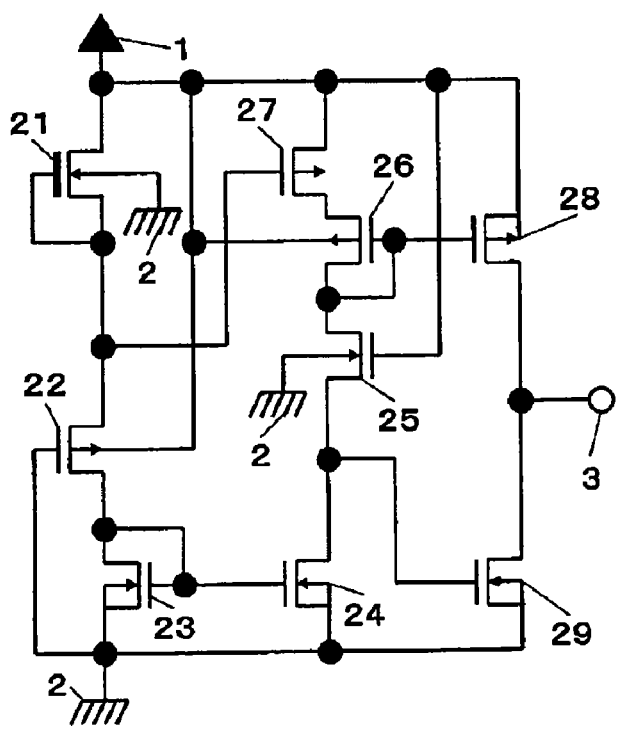
FIG. 4 is a diagram illustrating constant current circuit of another circuit for detecting power supply voltage drop according to the present invention.
Figure 5:
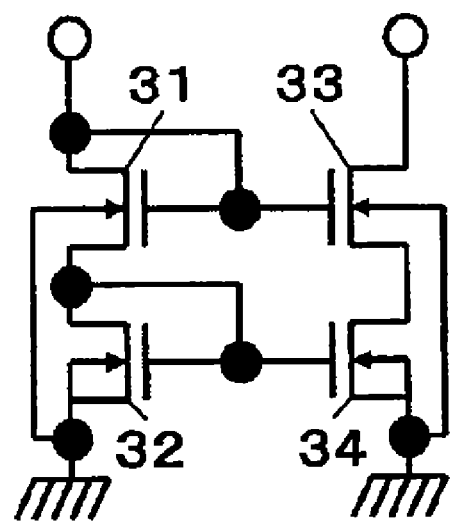
FIG. 5 is a diagram illustrating an example of an element circuit.
Figure 6:
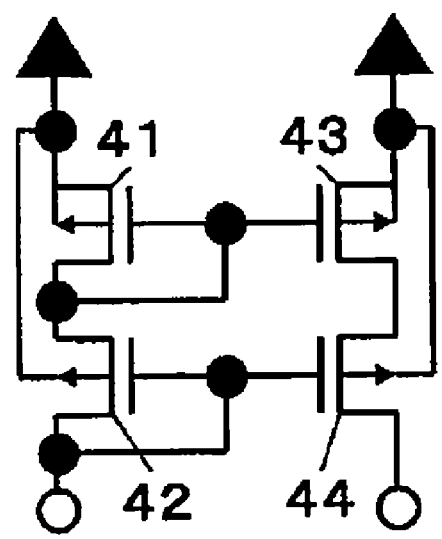
FIG. 6 is a diagram illustrating an example of another element circuit.
Figure 7:
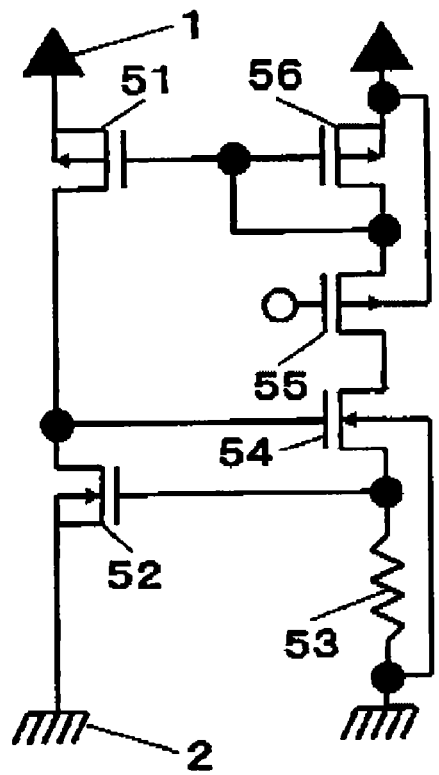
FIG. 7 is a diagram illustrating an example of still another element circuit.
Figure 8:
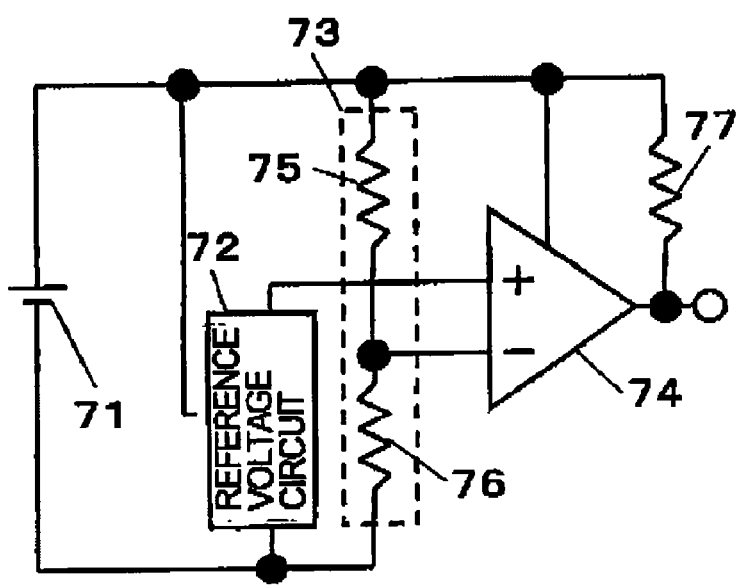
FIG. 8 is a diagram illustrating a conventional circuit for detecting power supply voltage drop.

FIG. 4 is a diagram illustrating constant current circuit of another circuit for detecting power supply voltage drop according to the present invention. In the difference of the constant current circuit for detecting power supply voltage drop in FIG. 2, the NMOS transistor 12 is replaced by a PMOS transistor 22. The NMOS transistor 17 is replaced by a PMOS transistor 27. The PMOS transistor 15 is replaced by an NMOS transistor 25. The PMOS transistor 19 is replaced by an NMOS transistor 29. Further, the depletion type NMOS transistor 11 is replaced by a depletion type NMOS transistor 21. The PMOS transistor 13 is replaced by an NMOS transistor 23. The PMOS transistor 14 is replaced by an NMOS transistor 24. The NMOS transistor 16 is replaced by a PMOS transistor 26. The NMOS transistor 18 is replaced by a PMOS transistor 28.

As in FIG. 3 or FIG. 4 forming the circuit for detecting power supply voltage drop, it is clear to be able to obtain the effect which is similar to the circuit for detecting power supply voltage drop as in FIG. 1 or FIG. 2.

What is claimed is:

1. A circuit for detecting power supply voltage drop, which detects a drop of a power supply voltage, comprising:
   a first transistor that is of a first conductive type and generates a source voltage based on a voltage obtained by subtracting an absolute value of a threshold voltage and an overdrive voltage from the power supply voltage with reference to the power supply voltage;
   a second transistor that is of the first conductive type and turned on/off based on the source voltage of the first transistor;
   a third transistor that is of a second conductive type and generates a source voltage based on a voltage obtained by adding an absolute value of a threshold voltage and an overdrive voltage to a ground voltage with reference to the ground voltage;
   a fourth transistor that is of the second conductive type and turned on/off based on the source voltage of the third transistor;
   a first constant current circuit that supplies a current to the first transistor;
   a second constant current circuit that supplies a current to each of the second transistor and the third transistor; and
   a third constant current circuit that supplies a current to the fourth transistor.

* * * * *